United States Patent [19]
Suzuki et al.

[11] Patent Number: 5,898,501
[45] Date of Patent: Apr. 27, 1999

[54] APPARATUS AND METHODS FOR MEASURING WAVEFRONT ABERRATIONS OF A MICROLITHOGRAPHY PROJECTION LENS

[75] Inventors: Jun Suzuki, Kawasaki; Takashi Gemma, Tokyo; Yutaka Ichihara, Yokohama, all of Japan

[73] Assignee: Nikon Corporation, Tokyo, Japan

[21] Appl. No.: 08/899,688

[22] Filed: Jul. 24, 1997

[30] Foreign Application Priority Data

Jul. 25, 1996 [JP] Japan ................................. 8-215399
Jul. 25, 1996 [JP] Japan ................................. 8-215400

[51] Int. Cl.$^6$ .................................................. G01B 9/02
[52] U.S. Cl. ................................... 356/359; 356/363
[58] Field of Search ........................... 356/357, 359, 356/360, 363, 352

[56] References Cited

U.S. PATENT DOCUMENTS 5,563,706 10/1996 Shibuya et al. ........................ 356/359
5,737,079 4/1998 Burge et al. ............................ 356/359

*Primary Examiner*—Robert Kim
*Attorney, Agent, or Firm*—Klarquist Sparkman Campbell Leigh & Whinston, LLP

[57] ABSTRACT

Apparatus and methods are disclosed for measuring wavefront aberrations microlithography projection lenses such as i-line or excimer laser projection lenses. The apparatus comprises an argon-ion laser irradiating a Fizeau surface that reflects reference light and transmits test light. The test light is reflected by a spherical reflecting surface to pass twice through the test lens and the Fizeau surface, to interfere with the reference light. A piezoelectric element changes the fringes slightly. An image-pickup device receives the interference fringes and outputs data to a processor that calculates corresponding wavefront aberrations of the test lens. For testing an i-line lens, the argon laser can be a single-mode, 363.8 nm laser. For testing a lens used with a KrF excimer laser, the argon laser can emit second-harmonic light at 248.25 nm.

23 Claims, 2 Drawing Sheets

APPARATUS AND METHODS FOR MEASURING WAVEFRONT ABERRATIONS OF A MICROLITHOGRAPHY PROJECTION LENS

FIELD OF THE INVENTION

The present invention relates to a wavefront aberration measuring apparatus and method, and more particularly to a wavefront aberration measuring apparatus and method which is suitable for performance evaluation of an exposure projection lens used in a semiconductor exposure apparatus that utilizes, for example, mercury-vapor i-line radiation or excimer laser light as the exposure radiation.

BACKGROUND OF THE INVENTION

The ever-decreasing feature size of new semiconductor devices has resulted in demand for increasingly high precision projection lenses for microlithography. To produce higher precision projection lenses, it is necessary to characterize performance, i.e., aberrations, of the lenses with higher accuracy.

Conventional performance evaluation of an i-line projection lens (a projection lens used in a microlithography device employing a mercury-vapor i-line light source) or an excimer projection lens (a projection lens used in a microlithography device employing an excimer laser light source) is conducted, for example, by a method in which a certain spatial test pattern is imaged through the lens to be tested. The performance of the test lens is evaluated based on the image of the test pattern produced by the lens compared to a standard.

This conventional method for evaluating i-line and excimer projection lenses poses certain problems. Because the test lens performance is evaluated based on imaging performance, i.e., by a spatial image measurement, aberrations of the test lens are not directly measured. Therefore, the performance or aberrations of the test lens cannot be determined with high accuracy. Without an accurate determination of the performance or aberrations of the test lens, it is impossible to obtain a computer simulation, based on the performance of the test lens as tested, with parameters such as illumination, spatial image characteristics, and image height being freely varied. Since the performance of the test lens cannot be measured with high accuracy, an indicated value for gap adjustment cannot be calculated. In other words, information required to calculate an adjustment for lens correction cannot be obtained. Thus a significant amount of time is required (for trial-and-error adjustments) to produce a lens having a desired performance.

A representative conventional apparatus for evaluating excimer projection lenses is disclosed in Japanese Laid-Open Patent Publication No. 1-134224. The disclosed apparatus includes: a narrow-band excimer laser; an interference optical system including means for splitting light from the excimer laser into two beams that traverse different optical paths having an adjustable path difference, and an image-pickup means for receiving an image of an interference pattern formed by recombining the beams; and a processing device for receiving information from the image-pickup means and calculating wavefront aberrations of a test lens placed in one of the split optical paths in the interference optical system.

Measuring wavefront aberrations of a test projection lens to a high degree of accuracy is difficult with the above-described proposed apparatus.

SUMMARY OF THE INVENTION

The present invention provides wavefront aberration-measuring apparatus and methods for a test lens. The apparatus and methods can measure aberrations of the test lens with high accuracy and shorten the production term of the lens. An apparatus of the present invention preferably comprises a light source for emitting highly coherent laser light. The apparatus also comprises an interference optical system that receives the laser light and irradiates a reference plane and the test lens with the laser light. Reference light reflected by the reference plane is combined with test light that makes a double pass through the test lens. (Light from the first pass is reflected back through the test lens by a spherical reflecting surface.) The combined reference light and test light forms interference fringes. The apparatus also comprises an interference-fringe scanner for changing the interference fringes slightly, by altering the relative phase relationship of the reference light and the test light. The apparatus also comprises an image-pickup device that receives images of the interference fringes and outputs information relating to the interference-fringe images. A processor calculates the wavefront aberrations of the test lens based on the information on the interference-fringe images from the image-pickup device.

With an apparatus according to the present invention, wavefront aberrations of the test lens can be obtained from calculations based on the interference-fringe image information, which is output from the image-pickup device while the interference fringes are finely scanned (i.e., slightly changed) with the interference-fringe scanner. Processing the wavefront aberrations allows for a computer simulation of lens performance including simulation with variation of such parameters such as illumination, spatial image characteristics, and image height, thereby providing computer simulation results for those parameters. In addition, an indicated value for gap adjustment (i.e., an indicated amount of adjustment for adjusting the lens) can be calculated based on the wavefront aberrations.

A argon (Ar) ion laser is preferably used as the light source in the device of the present invention. The argon-ion laser provides sufficient coherence length such that a Fizeau-type interferometer may be employed with resulting improved detection of wavefront aberrations. The Fizeau-type interferometer (an interferometer in which the reference plane transmits the test light), is less affected by error factors arising from external disturbances such as air motion or vibration.

For testing an i-line lens, a single-mode argon-ion laser with a 363.8-nm wavelength is preferred (a wavelength relatively close to the 365-nm wavelength of i-line radiation). For testing a excimer lens for use with, e.g., a KrF excimer source, the preferred test radiation is the second harmonic of an argon-ion laser with a fundamental frequency corresponding to a wavelength of 496.5 nm. Utilizing the second harmonic radiation provides light with a wavelength of 248.25 nm, one-half the wavelength of the fundamental frequency. The 248.25-nm wavelength is relatively close to the 248.385-nm wavelength of KrF excimer laser light.

In the Fizeau interferometer as implemented in the present invention, the optical path of the reference light is identical to a portion of the optical path of the test light, thereby minimizing the path length of the optical path(s) not common to both the reference light and test light. Error factors due to external disturbances such as air motion or vibration are thus minimized, and wavefront aberrations can be obtained with higher accuracy.

The interference-fringe scanner of the apparatus of the present invention is preferably configured for slightly displacing either the reference plane or the reflective spherical plane along the direction of the associated optical-axis. A piezoelectric device is preferred for this purpose.

An apparatus of the present invention may further include a stage for moving the reference surface and a stage for moving the reflective spherical surface in x, y, and z directions, and a length-measuring interferometer for precisely measuring the positions of the reference surface and the reflective spherical surface. The reference plane and the reflective spherical plane may be moved in the x, y, and z, directions by the stage while the positions of the reference plane and the reflective spherical plane are being measured by the interferometer, whereby wavefront aberration measurements can be obtained with high accuracy at various positions. Thus wavefront aberrations, including not only on-axis aberrations, but also other aberrations such as off-axis aberrations, curvature of field, image distortion, and magnification can be measured with high accuracy.

The processor is preferably also operable to correct for any chromatic aberration due to the difference between the wavelength of the argon-ion laser light and the wavelength of the radiation with which the test lens is intended for use. A wavelength monitor may be employed to monitor the output of the argon-ion laser, allowing the processor to compensate for any deviations in wavelength of the test light.

According to a preferred method according to the present invention, wavefront aberrations of a projection lens to be tested are measured by irradiating a Fizeau lens and the test lens with a single-mode argon-ion laser light. Reference light is reflected by a Fizeau surface of the Fizeau lens. Test light passes through the Fizeau surface and through the test lens, and is reflected by a reflective spherical surface to pass back through the test lens and the Fizeau surface in the opposite direction, thereby combining with the reference light and forming interference fringes. The interference fringes are sensed by an image sensor while being scanned (i.e., slightly changed). Wavefront aberrations of the test lens are then calculated based on image information, from the image sensor, resulting from images of the scanned interference fringes.

According to the preferred method, by picking up an image of the interference fringes while the interference fringes are being slightly changed, wavefront aberrations of the test lens can be determined from calculations based on the image information of the observed interference fringes. Processing the wavefront aberrations enables computer simulations of lens performance in which parameters including illumination, spatial image characteristics, and image height are changed freely. In addition, an indicated value for gap adjustment can be calculated based on the wavefront aberrations. Accordingly, the aberrations of the test lens can be determined with high accuracy and information necessary for lens correction or adjustment is also obtained.

In the preferred method, the optical path of the reference light is the same as a portion of the optical path of the test light, thereby minimizing the total optical path length not traversed by both the reference light and the test light, so that errors due to external disturbances such as vibration and air turbulence are reduced as much as possible. This permits a highly precise measurement.

The foregoing and other objects, features, and advantages of the invention will become more apparent from the following detailed description of example embodiments which proceeds with reference to the accompanying drawings.

DETAILED DESCRIPTION

Figure 1:
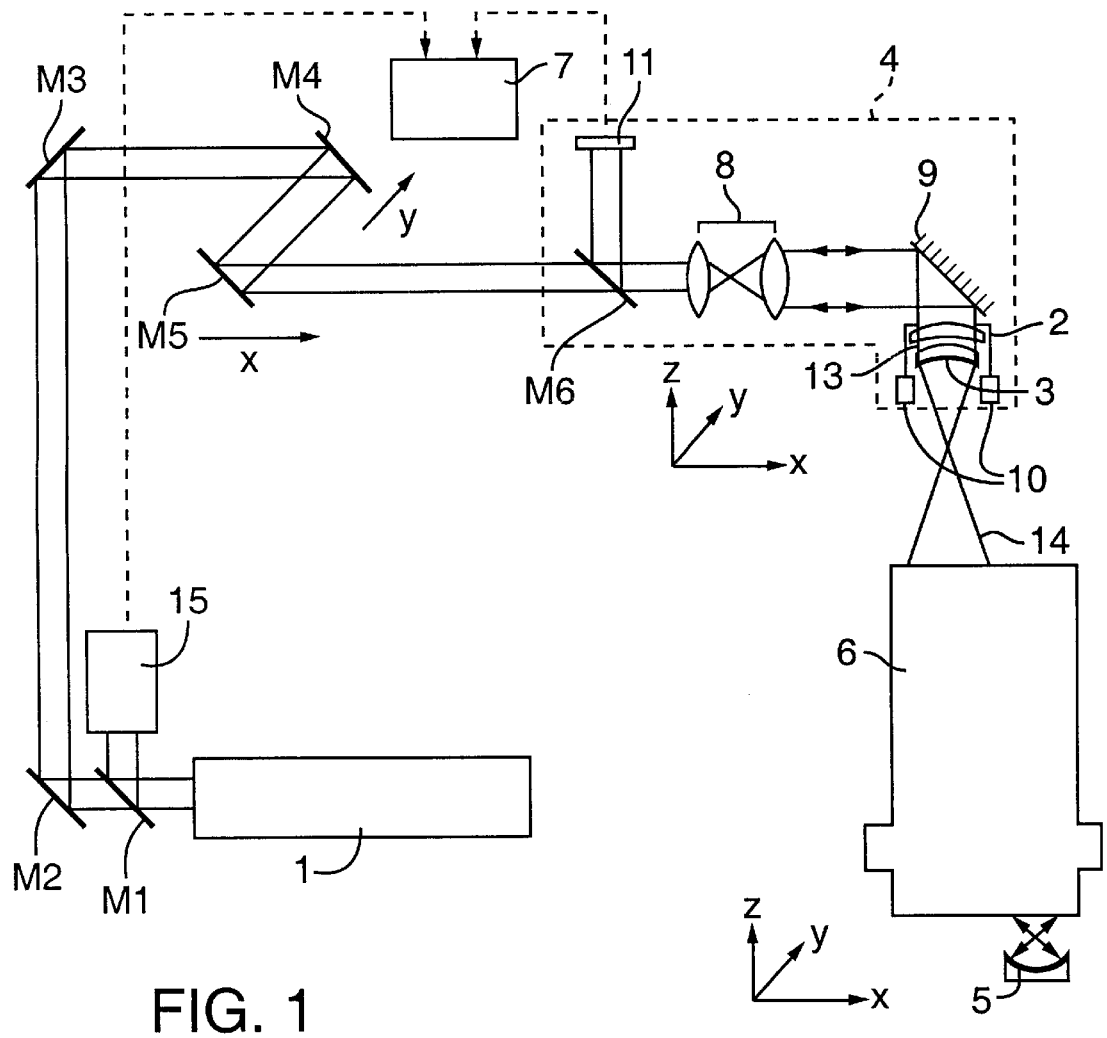
FIG. 1 is a schematic diagram of a wavefront aberration-measuring apparatus for an i-line lens according a preferred embodiment of the present invention.

FIG. 1 illustrates a wavefront aberration-measuring apparatus, according to a preferred embodiment, for a testing a projection lens as used in a projection lithography apparatus, e.g., a projection lithography apparatus employing an i-line (365 nm from a mercury vapor lamp) or excimer laser light source for projection illumination. The measuring apparatus can be used to evaluate aberration performance of the projection lens. Henceforth, in FIG. 1, the lens 6 whose performance is evaluated is referred to as the "test lens" 6.

The wavefront aberration-measuring apparatus shown in FIG. 1 comprises an argon-ion laser 1 for emitting argon-ion laser light; mirrors M2, M3, M4, and M5 for guiding the argon-ion laser light to a wavefront interferometer section (i.e., an interference optical system) 4, comprising a Fizeau lens 2, a piezoelectric element 10 for scanning interference fringes (changing interference fringes slightly), and an image-pickup device 11 such as a camera; and a processing device 7 for conducting arithmetic operations including calculations for determining wavefront aberrations or other properties of the test lens 6. The embodiment as shown in FIG. 1 utilizes a Fizeau-type interferometer.

Figure 2:
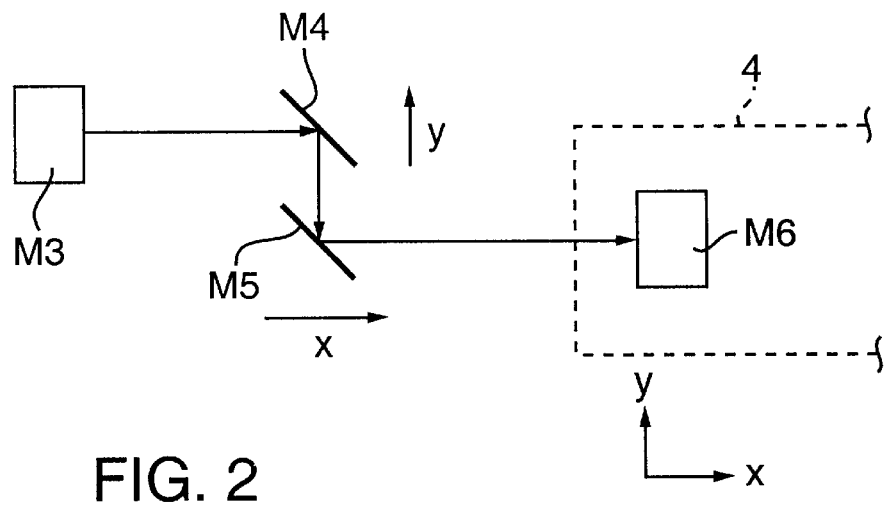
FIG. 2 is a plan view of a laser light-guiding section of the embodiment of FIG. 1.

As shown in FIGS. 1 and 2, the single-mode argon-ion laser light (henceforth referred to simply as laser light) emitted from the argon-ion laser 1 passes through a half mirror Ml and is then reflected, by the mirror M2, the mirror M3, the mirror M4 and the mirror M5 in this order, to reach a half mirror M6 of the wavefront interferometer section 4. Specifically, the laser light is emitted in a −x direction from the argon-ion laser 1 and is reflected in a +z direction, orthogonal to the x direction, by the mirror M2. The light traveling in the +z direction is then reflected by the mirror M3 in the +x direction. The light is reflected by the mirror M4 in a −y direction, the y direction being orthogonal to the x and z directions. The light traveling in the −y direction is then reflected by the mirror M5 in the +x direction to reach the half mirror M6. The x and y directions are preferably in a horizontal plane, with the z direction being upward from the horizontal plane.

In the wavefront interferometer section 4, the laser light passing through the half mirror M6 is expanded by a beam expander 8, and then is reflected (in the −z direction) by a reflection mirror 9 to a Fizeau lens 2. The Fizeau lens 2 comprises a Fizeau plane 3, which is the last spherical plane of the Fizeau lens 2. The Fizeau plane transmits test light, in the −z direction, to the test lens 6, and reflects reference light, in the +z direction, back to the reflection mirror 9.

Test light passing through the test lens 6 in the −z direction is reflected by a reflective spherical surface 5 to pass back through the test lens 6 and the Fizeau lens in the +z direction. The test light thus combines with the reference light to form interference fringes. The combined test and reference light is reflected by the half mirror M5 to the image-pickup device 11, which senses the images of the interference fringes and passes information about the images to the processing device 7.

In the case where an exposure is carried out, a reticle (not shown) is placed at a focal-point position of the Fizeau lens 2, and a wafer (not shown) is placed at a focal-point position (i.e., a curvature center) of the reflective spherical surface 5.

The piezoelectric element 10 deforms in accordance with an input signal, e.g., a voltage signal. The piezoelectric element 10 is attached to the Fizeau lens 2 in such a way that the deformation of the piezoelectric element 10 enables the Fizeau lens 2 to move finely along the optical-axis direction (+z direction). The micro-movement or small displacement of the Fizeau lens 2 scans, i.e., makes small changes in, the interference fringes produced by the wavefront interferometer section 4.

The wavefront interferometer section 4 including the Fizeau lens 2 is preferably mounted on a three-axis stage movable in the x, y, and z directions. The reflective spherical plane 5 is mounted on another three-axis stage. A length-measuring interferometer, not shown, for measuring the effective position of a focal point of the Fizeau lens 2 and a focal point (curvature center) of the reflective spherical surface 5 is provided.

The mirror M5 does not move in the x direction but moves in the y direction together with the wavefront interferometer section 4, as shown in FIG. 2. This arrangement allows continuous illumination of the half mirror M6, and of the wavefront interferometer section 4 with laser light from the argon-ion laser 1 when the wavefront interferometer section 4 and the reflective spherical plane 5 are driven in the x and y directions.

The operation of the above-described embodiment will now be explained.

The laser light emitted from the argon-ion laser 1 is reflected by the mirror M2, the mirror M3, the mirror M4, and the mirror M5 in this order to reach the half mirror M6 of the wavefront interferometer section 4. The laser light passing through the half mirror M5 is expanded by the beam expander 8, and then is reflected by the reflection mirror 9 to the Fizeau lens 2. The Fizeau plane 3 of the Fizeau lens 2 reflects reference light 13 and transmits test light 14. The test light passes through the test lens 6 and is reflected by the reflective spherical surface 5 to return in the opposite direction through the test lens 6 and the Fizeau plane. The reference light 13 and the test light 14 are thus combined to form interference fringes. The combined reference and test light, forming interference fringes, is further reflected by the reflection mirror 9. The interference fringes are transferred to the image-pickup device 11 via the beam expander 8 and the half mirror M6. An image of the interference fringes is picked up or sensed by the image-pickup device 11. The image-pickup device 11 outputs a signal indicative of image information of the interference fringes to the processing device 7.

The image-pickup device 11 receives the image of the interference fringes while the pattern of the interference fringes is being slightly changed (i.e., scanned) by driving Fizeau lens 2 finely in the direction of the optical-axis, using the piezoelectric element 10. Based on the signal carrying the image information of the interference fringes, which signal is output from the image-pickup device 11, the processing device 7 calculates wavefront aberrations of the test lens 6. The calculation result can be represented by the processing device 7 on a display device (not shown), or it can be printed out by a printer (not shown).

Thus, according to the above-described embodiment, wavefront aberrations of the test lens 6 can be obtained directly, based on the image of the interference fringes, formed with the wavefront interferometer section 4 while the fringes are being finely changed (scanned) using the piezoelectric element 10. Processing the wavefront aberrations enables computer simulation of the performance of the test lens 6, including simulations in which parameters such as illumination characteristics, spatial image characteristics, and image height are freely varied. In addition, an indicated value for gap adjustment can be calculated from the wavefront aberrations. Accordingly, the performance of the test lens 6 can be evaluated with high accuracy, and the production term of a lens having a desired performance can be shortened considerably.

According to the above-described embodiment, changing the positions of the wavefront interferometer section 4 and the reflective spherical plane 5 by using a three-axis stage, not shown, allows measurement of aberrations at an arbitrary image position. Therefore, not only on-axis aberrations but also other aberrations such as off-axis aberrations, curvature of field, image distortion, and magnification can be measured.

In the embodiment described above, for testing an i-line lens, a single-mode argon-ion laser is employed, having a wavelength of 363.8 nm. Although there is a difference between the wavelength (363.8 nm) of the single-mode argon-ion laser light and the wavelength (365 nm) of i-line radiation, compensation for chromatic aberration arising from the wavelength difference can be made using the processing device 7.

Similarly, in the embodiment described above, for testing an excimer lens intended for use with a KrF excimer laser, a argon laser is employed that produces light with a wavelength of 248.25. This is achieved by a laser emitting the second harmonic of the fundamental frequency corresponding to a wavelength of 496.5 nm. Although there is a difference between the wavelength (248.25 nm) of the second harmonic argon-ion laser light and the wavelength (248.385 nm) of KrF excimer laser radiation, compensation for chromatic aberration arising from the wavelength difference can be made using the processing device 7.

Use of argon-ion laser light increases the coherence length compared to other sources, thereby allowing employment of the Fizeau-type interferometer in the wavefront interferometer section 4. In the Fizeau-type interferometer, the test light 14 passes through the Fizeau plane 3, and the optical path of the reference light is contained within a part of the optical path of the test light 14, so that errors due to external disturbances such as vibration or air movement are minimized. Accordingly, the wavefront aberrations of the test lens 6 can be obtained with higher accuracy.

In the above-described embodiment, the mirror M5 moves in the y direction together with the wavefront interferometer section 4. Therefore, even when the wavefront interferometer section 4 and the reflective spherical plane 5 are moved in the x and y directions, the half mirror M6 of the wavefront interferometer section 4 can always be irradiated with the laser light emitted from the argon-ion laser 1.

Figure 3:
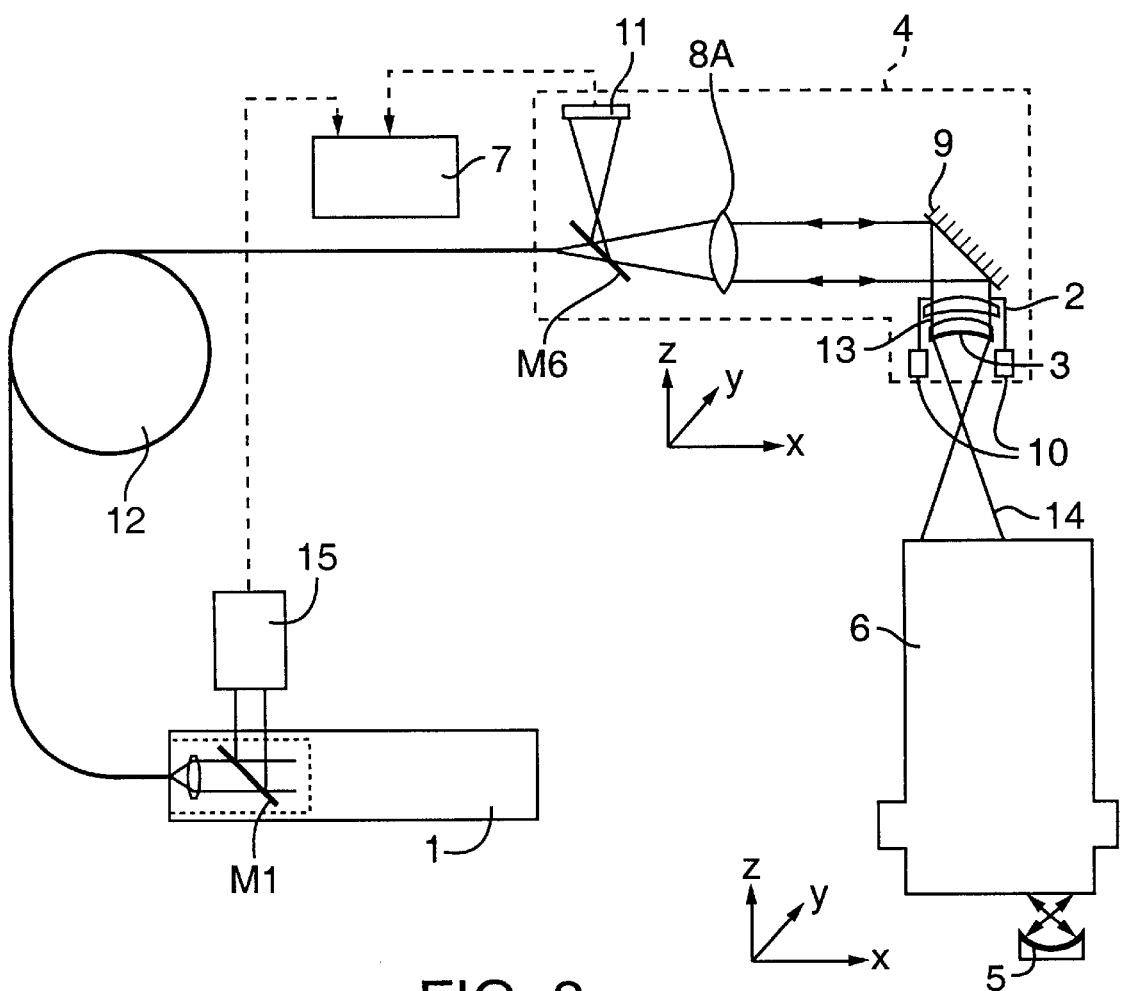
FIG. 3 is a schematic diagram of a wavefront aberration-measuring apparatus for an i-line lens according to another embodiment of the present invention.

FIG. 3 illustrates a wavefront aberration-measuring apparatus, for an i-line lens or for an excimer lens, according to another embodiment of the invention.

In the embodiment of FIG. 3, an optical fiber 12 guides the laser light emitted from the argon-ion laser 1 to the half mirror M6 of the wavefront interferometer section 4. The output end of the optical fiber 12 is positioned at a focal point position of a collimator lens 8A which is provided in place of the beam expander 8 of the embodiment of FIG. 1. The laser light which is emitted from the output end of the optical fiber 12 and passes through the half mirror M6 is collimated by the collimator lens 8A to produce a parallel beam. The configuration of the FIG. 3 embodiment is essentially similar to that of the embodiment of FIG. 1 in all other respects.

In the embodiment of FIG. 3, the laser light can be easily guided through the optical fiber 12 to the half mirror M6 of the wavefront interferometer section 4, and the mirrors M2 to M5 of the embodiment of FIG. 1 can be omitted. As a result of the omission, the structure of the measuring apparatus is simplified, and procedures for adjusting optical components of the apparatus, such as mirrors, are likewise simplified.

Next will be described an embodiment of a wavefront aberration measuring method, especially for an i-line or an excimer lens, according to the present invention. The method can be performed, for example, by using the wavefront aberration-measuring apparatus as illustrated in FIG. 1. The method includes the steps of:

(1) irradiating a Fizeau lens 2 having a Fizeau surface 3 with argon-ion laser light, so that reference light 13 is reflected by the Fizeau surface 3 of the Fizeau lens 2, and test light 14 is transmitted by the Fizeau surface 3 of the Fizeau lens 2;

(2) allowing the test light to pass through the test lens 6 and to be reflected by a reflective spherical surface 5 to return through the test lens 6 and the Fizeau surface 3, to combine with the test light to form interference fringes;

(3) scanning (slightly or finely changing) the interference fringes;

(4) receiving images of the interference fringes while the interference fringes are being scanned; and (5) calculating wavefront aberrations of the test lens based on the image of the received interference fringes.

According to the wavefront aberration-measuring method as described above, the wavefront aberrations of the test lens 6 can be obtained directly, based on the image information of the interference fringes, by picking up the image of the interference fringes while the interference fringes are scanned. Furthermore, since the non-common portions of the optical paths of the test light and the reference light are minimized, errors due to an external disturbance such as vibration or air motion are reduced, and the wavefront aberrations of the test lens 6 can be obtained with high accuracy. Since the lens testing is conducted without being subjected to exposure and development processes, the test measurements are not affected by factors other than lens performance (e.g., exposure conditions, development conditions, and so on), thereby allowing accurate measurement of the test lens.

Having illustrated and demonstrated the principles of the invention in the above-described embodiments, it should be apparent to those skilled in the art that the described embodiments can be modified in arrangement and detail without departing from such principles. I claim as the invention all that comes within the scope of the following claims.

What is claimed is:

1. A wavefront aberration-measuring apparatus for measuring wavefront aberrations of an exposure projection lens for an exposure device for microlithography, the exposure projection lens being selected as a test lens to be observed with the apparatus, the apparatus comprising:

(a) a reference surface, (b) a laser light source arranged to provide reference light to the reference surface and test light to the test lens;

(c) a spherical reflective surface arranged to reflect the test light, that has passed through the test lens in a first direction back through the test lens in a second direction, opposite the first direction;

(d) an image-pickup device arranged to receive reference light from the reference surface and test light from the test lens, returning from the test lens in the second direction, such that interference fringes are formed by the reference light and test light at the image-pickup device and are sensed by the image-pickup device;

(e) an interference-fringe scanner arranged to scan the interference fringes sensed by the image-pickup device by altering a phase relationship between the test light and the reference light at the image-pickup device; and (f) a processor arranged to receive information from the image-pickup device to calculate wavefront aberrations of the test lens based on the scanned interference fringes sensed by the image-pickup device.

2. The wavefront aberration-measuring apparatus of claim 1, wherein the processor corrects a chromatic aberration due to a difference between a wavelength of light from the laser light source and a wavelength of light for which the test lens is designed.

3. The wavefront aberration-measuring apparatus of claim 1, wherein the laser light source comprises an argon-ion laser.

4. The wavefront aberration-measuring apparatus of claim 3, wherein the argon-ion laser is adapted to emit a single-mode argon-ion laser light.

5. The wavefront aberration-measuring apparatus of claim 4, wherein the argon-ion laser is adapted to emit a second-harmonic argon-ion laser light.

6. The wavefront aberration-measuring apparatus of claim 3, wherein the processor corrects a chromatic aberration due to a difference between the wavelength of the laser light from the argon-ion laser and a wavelength of light for which the test lens is designed.

7. The wavefront aberration-measuring apparatus of claim 6, wherein the emitted laser light has a wavelength of 363.8 nm.

8. The wavefront aberration-measuring apparatus of claim 6, wherein the emitted laser light has a wavelength of 248.25 nm.

9. The wavefront aberration-measuring apparatus of claim 6, further comprising a Fizeau type interferometer, the reference surface reflecting the reference light and transmitting the test light, wherein the interference-fringe scanner displaces one of the reference surface and the spherical reflective surface in a direction along an optical axis of the test lens.

10. The wavefront aberration-measuring apparatus of claim 9, wherein the emitted laser light has a wavelength of 363.8 nm.

11. The wavefront aberration-measuring apparatus of claim 9, wherein the emitted laser light has a wavelength of 248.25 nm.

12. The wavefront aberration-measuring apparatus of claim 9, further comprising a stage for moving the reference plane and a stage for moving the spherical reflective surface in x-, y-, and z- directions, and a length-measuring interferometer for measuring positions of the reference plane and the spherical reflective surface.

13. The wavefront-aberration-measuring apparatus of claim 12, wherein the emitted laser light has a wavelength of 363.8 nm.

14. The wavefront aberration-measuring apparatus of claim 12, wherein the emitted laser light has a wavelength of 248.25 nm.

15. The wavefront aberration-measuring apparatus of claim 2, further comprising a Fizeau type interferometer, the reference surface reflecting the reference light and transmitting the test light.

16. The wavefront aberration-measuring apparatus of claim 1, further comprising a Fizeau type interferometer, the reference surface reflecting the reference light and transmitting the test light.

17. The wavefront aberration-measuring apparatus of claim 16, wherein the interference-fringe scanner slightly displaces one of the reference surface and the spherical reflective surface in a direction along an optical-axis of the test lens.

18. The wavefront aberration-measuring apparatus of claim 16, further comprising a stage for moving the reference plane and a stage for moving the spherical reflective spherical surface in x-, y-, and z- directions, and a length-measuring interferometer for measuring positions of the reference plane and the spherical reflective surface.

19. The wavefront aberration-measuring apparatus of claim 1, further comprising a stage for moving the reference plane and a stage for moving the spherical reflective surface in x-, y-, and z- directions, and a length-measuring interferometer for measuring positions of the reference plane and the spherical reflective surface.

20. The wavefront aberration-measuring apparatus of claim 1, wherein the interference-fringe scanner slightly displaces one of the reference surface and the spherical reflective surface in a direction along an optical-axis of the test lens.

21. A wavefront aberration-measuring method for measuring wavefront aberrations of an exposure projection lens for a microlithography apparatus, the exposure projection lens being selected as a test lens to be observed, the method comprising the steps:

(a) providing a spherical reflecting surface and a Fizeau lens, having a Fizeau surface;

(b) irradiating the Fizeau lens with argon laser light, such that a reference light is reflected by the Fizeau surface of the Fizeau lens, and such that a test light passes through the Fizeau surface of the Fizeau lens;

(c) allowing the test light from the Fizeau lens to pass through the test lens in a first direction, and to reflect from the spherical reflecting surface back through the test lens and the Fizeau lens in a second direction opposite the first direction, so as to produce interference fringes;

(d) scanning the interference fringes by varying the relative phase of the test light and the reference light;

(e) receiving images of the interference fringes while scanning the interference fringes, and converting the received images into corresponding electrical signals; and (f) from the electrical signals, determining wavefront aberrations of the test lens based on the received images of the interference fringes.

22. The wavefront aberration-measuring method of claim 21, wherein the argon laser is a single-mode argon laser.

23. The wavefront aberration-measuring method of claim 22, wherein the argon laser emits second-harmonic argon laser light.

* * * * *